United States Patent [19]

Lowis et al.

[11] Patent Number: 5,563,760
[45] Date of Patent: Oct. 8, 1996

[54] TEMPERATURE SENSING CIRCUIT

[75] Inventors: Royce Lowis, Stockport; Edward S. Eilley, Reigate; Paul T. Moody, Oldham, all of England; Aart G. Korteling, E. Waalre, Netherlands; Brendan P. Kelley, Stockport, England

[73] Assignee: U.S. Philips Corporation, New York, N.Y.

[21] Appl. No.: 760,560

[22] Filed: Sep. 16, 1991

[30] Foreign Application Priority Data

Sep. 24, 1990 [GB] United Kingdom ............... 9020731

[51] Int. Cl.⁶ .................................................. H02H 5/04
[52] U.S. Cl. .......................................... 361/103; 323/907
[58] Field of Search ................................. 366/103, 106; 323/907, 315, 316, 365, 366, 369

[56] References Cited

U.S. PATENT DOCUMENTS

| | | | |
|---|---|---|---|
| 3,085,193 | 4/1963 | Perino | 323/366 |
| 4,136,354 | 1/1979 | Dobkin | 357/36 |
| 4,268,887 | 5/1981 | Ghiringelli et al. | 361/93 |
| 4,952,865 | 8/1990 | Pataut et al. | 323/313 |
| 4,971,921 | 11/1990 | Fukunaga et al. | 437/29 |
| 4,987,379 | 1/1991 | Hughes | 330/253 |
| 5,039,878 | 8/1991 | Armstrong et al. | 323/907 |

FOREIGN PATENT DOCUMENTS

| | | |
|---|---|---|
| 58-053730 | 3/1983 | Japan . |
| 59-178014 | 10/1984 | Japan . |
| 2210501 | 6/1989 | United Kingdom . |
| 2222497 | 3/1990 | United Kingdom . |

Primary Examiner—Jeffrey A. Gaffin
Assistant Examiner—Ronald W. Leja
Attorney, Agent, or Firm—Bernard Franzblau

[57] ABSTRACT

A temperature sensing circuit (100) for sensing the temperature of an active semiconductor device, for example, a power MOSFET (11) of a semiconductor body (10). The circuit has a first temperature sensing device (R1R2) provided on the semiconductor body at a first position ($P_1$) adjacent a periphery (12) of the active semiconductor device (11), a second temperature sensing device (R3,R4) provided on the semiconductor body at a second position ($P_2$) further from the periphery of the active semiconductor device than the first position. An arrangement, for example, a comparator responsive to the first and second temperature sensing devices provides a control signal to switch off the active semiconductor device (11) when the difference in the temperature sensed by the first and second sensing devices reaches a predetermined value.

21 Claims, 4 Drawing Sheets

5,563,760

TEMPERATURE SENSING CIRCUIT

BACKGROUND OF THE INVENTION

This invention relates to a temperature sensing circuit for sensing the temperature of an active semiconductor device of a semiconductor body, for example, for sensing the temperature of a power MOSFET.

Various different forms of circuits for sensing the temperature of active semiconductor devices such as power MOSFETs have been proposed. Thus, for example, EP-A-341482 proposes providing a bipolar transistor in thermal contact with the active semiconductor device and using the increase with temperature of the current through the bipolar transistor to control the switching of a MOSFET which provides a signal indicative of an undesired temperature rise. EP-A-224274 adopts a different approach by providing a temperature sensitive polycrystalline silicon diode on top of the active semiconductor device.

The use of such temperature sensing circuits is of particular interest in the field of so-called 'smart-power' devices in which control functions provided by low voltage logic devices are integrated with power semiconductor devices, such as power MOSFETs, to provide intelligent power switches for use in high-volume applications such as automative control systems.

It is desirable in such devices for the power device to be switched off or shut down if it overhears because, for example, of a short-circuit. However, in order to provide high current handling capability power semiconductor devices are generally rather large area devices and in certain overload conditions, for example, if a low resistance, say about 100 mΩ (milli-ohm), load is connected between ground and the power semiconductor device, the temperature at the centre of the power semiconductor device can rise rapidly whereas the temperature of the semiconductor body surrounding the power semiconductor device may rise considerably more slowly. In such circumstances, the provision of a temperature sensitive device in thermal contact with the power semiconductor device may not provide a sufficiently accurate or rapid response to the change in temperature of the power semiconductor device. Also, where the temperature sensitive element is provided on top of the active semiconductor device, the accuracy of the temperature sensing may be adversely affected, especially if the thermal contact to the active semiconductor device is not particularly good.

SUMMARY OF THE INVENTION

It is an object of the present invention to provide a temperature sensing circuit which enables rapid rises in the temperature of the centre of an active semiconductor device such as a power MOSFET, to be detected and to be used to control the switching on or off of the active device.

According to the present invention, there is provided a temperature sensing circuit for sensing the temperature of an active semiconductor device of a semiconductor body, characterised in that the circuit comprises a first temperature sensing device provided on the semiconductor body at a first position adjacent the active semiconductor device, a second temperature sensing device provided on the semiconductor body at a second position remote from the active semiconductor device more particularly, remote from the periphery of the active semiconductor device, and means responsive to the first and second temperature sensing devices for providing a control signal to switch off the active semiconductor device when the difference in the temperatures sensed by the first and second sensing devices exceeds a predetermined value.

The first temperature sensing device may be provided adjacent the periphery of the active semiconductor device so that the second temperature sensing device is further from the periphery than the first temperature sensing device.

A temperature sensing circuit in accordance with the invention thus provides first and second temperature sensitive devices, one close to, and the other further from, the active device thereby enabling the temperature difference between the two temperature sensitive devices to be determined. In certain conditions in active semiconductor devices such as power MOSFETs, for example, where a low resistance (say about 100 mΩ), load is connected between ground and the active semiconductor device, the temperature at the centre of the active semiconductor device rises much more quickly than that of the surrounding semiconductor body so that a steep temperature gradient occurs at the periphery of the active semiconductor device. A temperature sensing circuit in accordance with the invention allows this steep temperature gradient to be detected and to be used to provide a signal to switch off the active semiconductor device before it overheats significantly. Accordingly, excessive temperatures can be detected quickly and the circuit can be particularly sensitive to temperature changes.

Generally, the temperature sensing devices have a given characteristic the value of which varies with temperature such that, when the difference in the temperatures sensed by the first and second temperature sensing devices reaches the predetermined value, the values of the given characteristics of the first and second temperature sensing devices are equal.

The temperature sensitive devices may, for example, have a resistance which varies with temperature and normally the temperature sensitive devices will have a positive temperature coefficient, that is their resistance increases with temperature.

In one embodiment, the first temperature sensing device comprises first and second temperature sensing elements and the second temperature sensing device comprises third and fourth temperature sensing elements and the temperature sensing elements are connected in a Wheatstone bridge with the first and third elements and the second and fourth elements, respectively, connected in series between first and second supply lines and with the second and third elements connected to the first supply line and the means responsive to the first and second temperature sensing devices comprises means for comparing a first signal representing the voltage at a first junction between the third and first elements and a second signal representing the voltage at a second junction between the second and fourth elements and for providing an output signal which provides the control signal to switch off the active semiconductor device when the difference between the first and second voltage signals represents a temperature difference of the predetermined value.

Such a Wheatstone bridge arrangement makes the circuit more sensitive as the difference signal being detected is amplified because the increase in temperature and thus resistance of the first heat sensitive element acts to increase the voltage at the first junction, whereas the similar increase in temperature experienced by the second heat sensitive element acts to reduce the voltage at the second junction.

The temperature sensing circuit may further comprise a transistor having its main current path connected between the first junction and the first element and another transistor having its main current path connected between the second junction and the fourth element with the gates of the transistors being connected to one another and to one of the first and second junctions. The incorporation of the current-mirror connected transistors should produce a larger differential gain which results in a lower accuracy requirement for the comparing means. Also, because this arrangement should have a higher sensitivity, it may be particularly useful where the elements have a smaller temperature coefficient of resistance or a higher noise margin.

In one example, a circuit in accordance with the invention may also comprise means for generating a proportional-to-absolute-temperature (PTAT) voltage and means for deriving a first current source for the first and third elements and a second current source for the second and fourth elements from the PTAT voltage.

The PTAT voltage generating means may comprise first and second semiconductor junction devices having respective outputs across which is generated the PTAT voltage and the current source deriving means may comprise a differential amplifier for which each semiconductor junction device provides an input signal to a respective one of the two inputs of the differential amplifier, a resistor connected in series between one of the semiconductor junction devices and an output transistor of the differential amplifier and a current mirror arrangement comprising first and second transistors for mirroring the current through the resistor. The first transistor is connected in series with the first and third elements for forming the first current source and the second transistor is connected in series with the second and fourth elements for forming the second current source. Such an arrangement should assist the performance of the circuit with respect to absolute temperature so that the predetermined value is, as desired, determined by the difference in the temperatures sensed and is not significantly affected by their actual values.

In other embodiments the first and second temperature sensitive devices may comprise semiconductor devices having a current carrying capacity which varies with temperature and the means responsive to the first and second temperature sensing devices may comprise a current mirror arrangement having a first transistor with one main electrode connected at a first junction to the first temperature sensing device so that its main current path is in series with the first temperature sensing device and a second transistor with one main electrode connected at a second junction to the second temperature sensitive device so that its main current path is in series with the second temperature sensing device. The gate of one of the first and second transistors is connected to its drain and to the gate of the other of the first and second transistors so that the voltage at the junction to which the said other one of the first and second transistors is connected provides an indication of the difference in the temperatures sensed by the first and second temperature sensing devices.

Generally, the current carrying capability of the first and second temperature sensing devices increases with temperature and the first temperature sensing device has a lower current carrying capability than the second temperature sensing device when the first and second temperature sensing devices are at the same temperature, but has a current carrying capability equal to that of the second temperature sensing device when the temperature difference between the first and second temperature sensing devices reaches the predetermined value and the second transistor is the gate-drain connected one of the first and second transistors so that the voltage at the first junction becomes high when the temperature difference reaches the predetermined value.

The first and second temperature sensing devices may comprise first and second transistors while a further current mirror arrangement may determine the current flowing through the second transistor with the level of the current being determined by the value of a resistor in the current mirror arrangement. Such an arrangement may be less sensitive to changes in the ambient temperature than a simple Wheatstone Bridge arrangement.

The first and second temperature sensing transistors may be formed by first and second insulated gate field effect transistors (IGFETs) operated in their subthreshold region and the current mirror arrangement may comprise a gate-drain connected third IGFET having its gate connected to the gates of the first and second IGFETs. The second IGFET may have a conduction channel region with a width which is larger than that of the conduction channel region of the first IGFET so that when the first and second IGFETs are at the same temperature the current carrying capability of the second IGFET is higher than that of the first IGFET. However, as the temperature of the first IGFET rises its gate threshold voltage will fall and its current carrying capability will increase so that when the temperature difference reaches the predetermined value the current carrying capability of the first IGFET matches that of the second IGFET allowing the voltage at the first junction to go high to provide a signal indicating that the predetermined value of the differential temperature has been reached.

The advantages of such an arrangement are that the use of the temperature dependence of the gate threshold voltage, with suitable biasing by the resistor, means that the circuit function is essentially independent of the ambient temperature of the second IGFET because of the near linear temperature coefficient of the threshold voltage of IGFETs operated in the subthreshold region.

In another example, the first and second temperature sensing devices may be formed by first and second bipolar transistors and the current mirror arrangement may comprise first, second and third IGFETs with the first and second IGFETs having their main current paths connected in series with the main current paths of the first and second bipolar transistors and the third IGFET having its gate and drain connected and its main current path being connected in series with a third bipolar transistor, each of the bipolar transistors having its base connected by respective resistors to its emitter and collector to form a base-emitter voltage Vbe multiplier for forming a source feedback for the associated IGFET and the second IGFET having a lower threshold voltage than the first IGFET. The second IGFET may have a conduction channel region having a width which is larger than that of the conduction channel region of the first IGFET.

The bipolar transistors thus form Vbe multipliers and provide source feedback for the IGFETs. As the temperature of the first bipolar transistor rises, its Vbe will fall reducing the negative feedback in the source of the first IGFET so that the current carrying capability of the series-connection of the first bipolar transistor and first IGFET increases until it matches that of the series-connection of the second bipolar transistor and second IGFET, at which point the voltage at the first junction will go high to provide a signal that the differential temperature has reached the predetermined value. Bipolar transistors have a simple R structure than IGFETs and can be matched more closely than IGFETs. Also, the IGFETs can be integrated close to one another to improve their matching.

The resistor associated with the further current mirror arrangement may be connected in series with a gate-drain connected transistor of two transistors forming another current mirror arrangement and the main current path of the other transistors of the said other current mirror arrangement connected in series with the main current path of the third IGFET. This enables both the physical size and the value of the resistor to be small and enables the first and second temperature sensitive devices to operate at a low current density allowing lower current consumption, improved sensitivity and/or occupation of a smaller area of the semiconductor body and a greater freedom in the choice of biasing currents for the temperature sensing devices.

Conveniently, means are provided for preventing the active semiconductor device from being switched on again until the temperature difference has fallen to a second predetermined value below the predetermined value. Such an arrangement introduces a hysteresis into the circuit and thus prevents the circuit from repeatedly switching the active semiconductor device on and off for small changes in temperature.

BRIEF DESCRIPTION OF THE DRAWINGS

Embodiments of the invention will now be described, by way of example, with reference to the accompanying drawings, in which.

DESCRIPTION OF THE PREFERRED EMBODIMENTS

Figure 1:
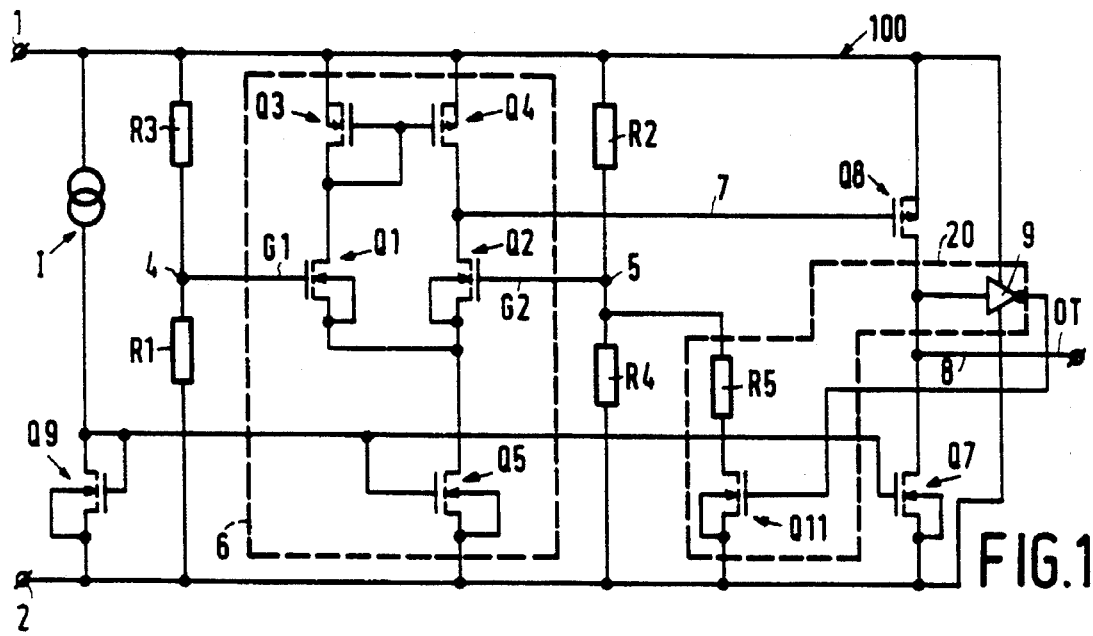
FIG. 1 shows a circuit diagram for one embodiment of a differential temperature sensing circuit in accordance with the invention.
Figure 3:
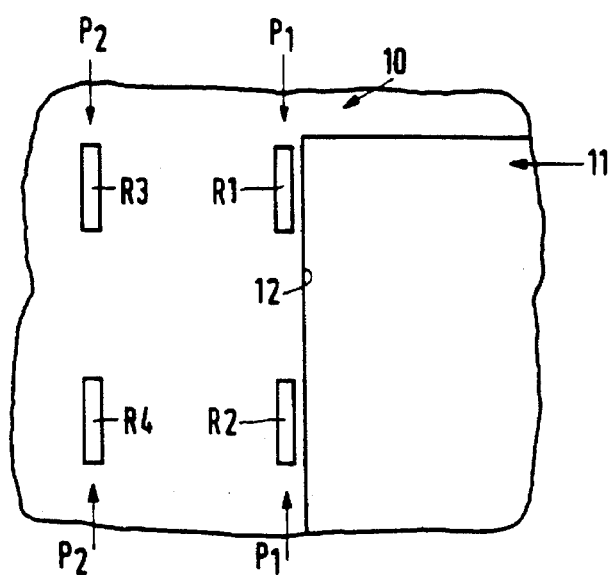
FIG. 3 is a plan view of a semiconductor body illustrating very schematically the relative locations of the active semiconductor device and the first and second temperature sensing devices.

Referring now to the drawings, for example, FIGS. 1 and 3, there is illustrated a temperature sensing circuit 100 for sensing the temperature of an active semiconductor device, in this example a power MOSFET 11, of a semiconductor body 10. The circuit comprises a first temperature sensing device R1,R2 provided on the semiconductor body 10 at a first position $P_1$ adjacent the active semiconductor device 11, a second temperature sensing device R3,R4 provided on the semiconductor body 10 at a second position $P_2$ remote from the periphery 12 of the active semiconductor device 11 and means $Q_1,Q_2,Q_3,Q_4,Q_5,Q_8$ responsive to the first and second temperature sensing devices R1,R2,R3,R4 for providing a control signal OT to switch off the active semiconductor device 11 when the difference in the temperatures sensed by the first and second sensing devices exceeds a predetermined value. The temperature sensing circuit 100 is electrically isolated from the active semiconductor device, i.e., power MOSFET 11, in the sense that the circuit 100 is not connected to the circuit in which the MOSFET 11 is electrically connected. The temperature sensing circuit 100 is a separate circuit from the circuit (not shown) which includes MOSFET 11 so that the two circuits are electrically separated or isolated from one another.

In the example shown in FIG. 1, the temperature sensing circuit has first and second power supply lines 1 and 2. The first power supply line 1 is the positive and the second power supply line 2 the negative supply line.

In this example, the first and second temperature sensing devices are provided as four temperature sensitive elements in the form of resistors R1 to R4 which provide a Wheatstone bridge connected between the power supply lines 1 and 2. Thus, the first temperature sensing device is formed by first and second resistors R1 and R2 provided in opposite arms of the Wheatstone bridge while the second temperature sensing device is formed by third and fourth resistors R3 and R4. The third and first resistors R3 and R1 are connected in series between the power supply lines 1 and 2 as are the second and fourth resistors R2 and R4 so that, as shown in FIG. 1, the second and third resistors R2 and R3 are connected to the first or positive supply line 1 while the first and fourth resistors R1 and R4 are connected to the second or negative supply line 2.

As will be explained in greater detail below with reference to FIG. 3, the first and second resistors R1 and R2 are located at a first position PI adjacent the periphery 12 of the active device 11 and so constitute hot resistors, that is they form resistors which experience the temperature changes at the periphery 12 of the active device 11, while the third and fourth resistors R3 and R4 are positioned further away from the periphery 12 of the active device 11 and so are 'cold' resistors which do not experience the temperature changes at the periphery 12 of the active device 11. In this example, the resistors R1 and R3 have positive temperature coefficients, that is their resistance increases with temperature.

The outputs from the Wheatstone bridge are taken from a first junction 4 between the third and first resistors R3 and R1 and a second junction 5 between the second and fourth resistors R2 and R4 and are supplied as respective inputs to a comparator 6 which provides a control signal to switch off the active semiconductor device 11 when the voltage at the first junction 4 exceeds the voltage at the second junction 5.

In this example, the resistors R1 to R4 are selected such that when all four resistors R1 to R4 are at the same temperature, the 'hot' first and second resistors R1 and R2 are of lower resistance than the third and fourth resistors R3 and R4. Thus, when there is no temperature difference between the first and second temperature sensitive devices R1,R2 and R3,R4, the voltage at the second junction 5 is higher than the voltage at the first junction 4 and the Wheatstone bridge does not reach a balance (that is the point at which the voltages at the first and second junctions 4 and 5 are equal) until the temperature of the first and second resistors R1 and R2 has increased sufficiently for their resistances to equal the resistances of the resistors R3 and R4.

By selecting the relative values of the resistors R1,R2 and R3,R4, the temperature gradient between the first and second temperature sensing devices R1,R2 and R3,R4 at which the comparator 6 provides a control signal to switch off the active device 11 can be selected. The respective values of the resistors R1 and R2 and the resistors R3 and R4 will be dependent upon many variables such as the characteristics of the resistors and other elements of the circuit and the respective distances of the resistors from the periphery 12 of the active semiconductor device 11. In this example, the resistance of the resistors R1 and R2 increases with temperature in such a manner that a balance is reached when there is a temperature difference of, for the values given above, 25° C. between the first and second temperature sensing devices. Any temperature difference exceeding this value will cause the active semiconductor device to be switched off.

In the circuit shown in FIG. 1, the comparator 6 comprises a differential pair of matched transistors Q1 and Q2 which form the input transistors of the comparator 6. In this example, the transistors Q1 and Q2 are n-channel MOSFETs with their gates G1 and G2 connected to the first and second junctions 4 and 5, respectively. The comparator 6 also includes two p-channel matched MOSFETs Q3 and Q4 having their source electrodes connected to the first supply line 1. The gate electrodes of the MOSFETs Q3 and Q4 are connected while the gate electrode of MOSFET Q3 is also connected to its drain. The MOSFETs Q3 and Q4 thus provide a current mirror arrangement and with their drain electrodes connected to respective ones of the drain electrodes of the MOSFETs Q1 and Q2 provide an active load for the differential pair Q1 and Q2.

The sources of the MOSFETs Q1 and Q2 are connected to the drain of an n-channel MOSFET Q5. The source of the MOSFET Q5 is connected to the second or negative supply line 2 while its gate is connected to the gate of a gate-drain connected n-channel MOSFET Q9 which is connected in series with a conventional current source I which may, in this example, be a resistor (typically with a resistance of 200 Kilo-ohms) connected between the supply lines 1 and 2 because, in this example, the voltages on the supply lines 1 and 2 are fixed. Alternatively, a suitable conventional external current source may be connected between the supply lines 1 and 2. The current source I forces current into MOSFET Q9 and this current is mirrored in MOSFET Q5 which thus acts as a current source of a value determined by the external current source I for the differential amplifier comparator 6. Other suitable structures may, of course, be used to form the comparator 6.

The output 7 of the comparator 6 is supplied to the gate of a p-channel MOSFET Q8 which has its source connected to the first supply line 1 and its drain connected via an n-channel MOSFET Q7 to the second supply line 2. The gate of the n-channel MOSFET Q7 is, like that of MOSFET Q5, connected to the external current source I and thus similarly acts as a current source of a value determined by the external current source I. The MOSFETs Q9,Q5 and Q7 are integrated together so as to be similar. It should be understood that, as used herein, the term 'similar' means that the devices, for example transistors, are integrated together so as to be matched or else so as to have a known ratio of effective junction areas so that the current I provided by the current source through the MOSFET Q9 is mirrored in the MOSFETs Q5 and Q7 with the currents through Q5 and Q7 being either equal to (where the transistors are matched) or a known multiple of the current through the MOSFET Q9. With appropriate modification of component values, it may be possible for the MOSFETs Q1 and Q2 and Q3 and Q4 forming the comparator 6 to have known ratios of effective junction areas rather than be precisely matched. The drain of the p-channel MOSFET Q8 provides, via line 8, the control signal OT for controlling the operation of the active semiconductor device 11 (FIG. 3). In addition the drain of p-channel MOSFET Q8 is connected to a NOT gate 9 in the form of an inverter which drives the gate of an n-channel enhancement mode MOSFET Q11. The n-channel MOSFET Q11 is connected in series with a resistor R5 and the series circuit of the n-channel MOSFET Q11 and resistor R5 is connected in parallel with the fourth temperature sensitive element R4.

Resistor R5, MOSFET Q11 and inverter or NOT gate 9 provide a hysteresis circuit 20. Thus, when the signal on the output 7 of the comparator 6 is high providing a low output signal OT from the MOSFET Q8 for turning off the active device 11, the NOT gate 9 provides a high input signal to switch on the MOSFET Q11, so connecting the resistor R5 in parallel with the fourth temperature sensing element R4. This reduces the effective resistance of the fourth temperature sensing element R4 so that the temperature of the first and second heat sensitive elements R1 and R2 has to drop to a second predetermined value, typically 20° C. (degrees Celsius), below the predetermined value before the output of the comparator 6 again goes low to provide a high signal OT to switch on the active device 11. This hysteresis circuit 20 prevents the temperature sensing circuit 100 from hunting or cycling, that is continually causing the active semiconductor device to switch on and off, with small temperature changes.

Figure 2:
FIG. 2 illustrates graphically a typical temperature profile from the centre to the periphery of a power MOSFET.

FIG. 2 illustrates graphically the change in temperature from the centre to the edge of a typical active semiconductor device such as a power MOSFET with a source-drain voltage of 21 volts and a power of dissipation of 300 watts when, for example, an overload of small resistance (for example about 100 m$\Omega$) is applied between the power MOSFET and ground.

Under such conditions where a relatively small resistance overload is so applied, the temperature at the centre of the power MOSFET will rise rapidly whereas the temperature in the bulk or remainder of the semiconductor body will rise only slowly. Accordingly, as illustrated in FIG. 2, a steep temperature gradient occurs adjacent the periphery 12 of the power MOSFET. By locating the first temperature sensing device, which in this case comprises the two heat sensitive elements R1 and R2, at a first position P1 adjacent, generally just outside, the periphery 12 of the power MOSFET and the second temperature sensing device, which in this case comprises the two temperature sensitive elements R3 and R4, at a second position P2 further from the periphery 12 of the active device 11 where the temperature is only changing slowly, if at all, with time as illustrated in FIG. 2, the temperature gradient at the periphery of the power MOSFET can be detected and when it reaches a certain value the power MOSFET can be switched off by the circuit described with reference to FIG. 1.

As indicated above, the temperature sensing circuit 100 is integrated in or on the same semiconductor body as the active device, in this example a power MOSFET. FIG. 3 indicates very schematically a plan view of the top surface of the semiconductor body 10 to show the relative locations of the periphery 12 of the power MOSFET 11 and the first and second temperature sensitive devices R1 to R4. The power MOSFET 11 will generally be a vertical MOSFET manufactured using conventional so-called DMOSFET technology and the various MOSFETs Q1 to Q11 (not shown in FIG. 3) will be manufactured at the same time as the power DMOSFET 11 using a known CMOS (complementary MOSFET) technology compatible with the DMOS technology. The temperature sensitive elements R1 to R4 and the resistor R5 may be formed using any suitable conventional technology, for example the resistors R1 to R4 and R5 may be formed as diffused regions or from a doped polycrystalline silicon layer. The use of diffused regions to form the resistors R1 to R4 is preferred as they should provide better thermal contact to the power MOSFET and should thus provide a more accurate detection of temperature. Typically, where the power MOSFET is a vertical DMOSFET having a surface area of 10 mm$^2$ and consisting of, for example, 10,000 to 20,000 parallel cells, then the 'hot' temperature sensitive elements R1 and R2 may be positioned at a first position P1 which is 125 µm distant from the MOSFET periphery 12 while the 'cold' temperature sensitive elements R3 and R4 may be positioned at a second position P$_2$ 1125 µm distant from the periphery 12 of the power MOSFET 11 and the resistances of the temperature sensitive elements R1 to R4 may be selected such that the comparator 6 provides a high output signal, resulting in a low signal OT to switch off the power MOSFET 11, when the temperature gradient between the first and second positions P$_1$ to P$_2$ reaches 25° C. In this example, the resistors R1 and R2 may have a resistance which is, for example, 0.9 times that of the resistors R3 and R4. It should be understood that the reference to the periphery 12 of the power MOSFET means the last row of cells and that the above measurements are taken between the periphery 12 and the centre of the resistors forming the temperature sensitive elements R1 to R4.

In the operation of the temperature sensing circuit 100 shown in FIG. 1, when there is no temperature difference between the resistors R1 to R4, then the voltage at the second junction 5 will be higher than that at the first junction 4 because, as discussed above, of the ratio of the resistances, so that the comparator 6 provides a low output on output line 7. The MOSFET Q8 is thus on and the output signal OT is high. As the temperature of the resistors R1 and R2 increases so does their resistance and at a temperature selected by the ratio of the resistors the bridge will come into balance. As the temperature of the resistors R1 and R2 increases further the resistance of the temperature sensitive elements R1 and R2 will be greater than the resistance of the temperature sensitive elements R3 and R4, so causing the voltage at the first junction 4 to exceed that at the second junction 5. Typically, this will be arranged to occur when there is a large, typically 25° C., temperature difference between the first and second positions P$_1$ and P$_2$. In such circumstances, the comparator 6 produces a high output signal on output line 7 to the gate of p-channel MOSFET Q8 so that the MOSFET Q8 is off and the circuit 100 provides a low output signal OT for switching off the active device, in this case the power MOSFET 11 shown schematically in FIG. 3. As mentioned above, at this time, the NOT gate 9 provides a high signal to switch on the MOSFET Q11 so connecting the resistor R5 in parallel with the fourth temperature sensing element R4.

As the power MOSFET 11 has now been switched off, the temperature difference between the first and second positions P$_1$ and P$_2$ will begin to decrease and when this temperature difference drops sufficiently, to reach the second lower predetermined value determined by the resistor R5, the voltage at the second junction 5 will rise above that at the first junction 4 causing the comparator 6 to provide a low output signal to the gate of the MOSFET Q8, so switching on the MOSFET Q8 and providing a high output signal OT to switch on the active device 11. At the same time, the inverter or NOT gate 9 provides a low signal switching off the MOSFET Q11 and so disconnecting the resistor R5 so that the comparator 6 will again provide a high output signal for switching off the active device 11 when the first higher predetermined temperature difference is reached.

Figure 4:
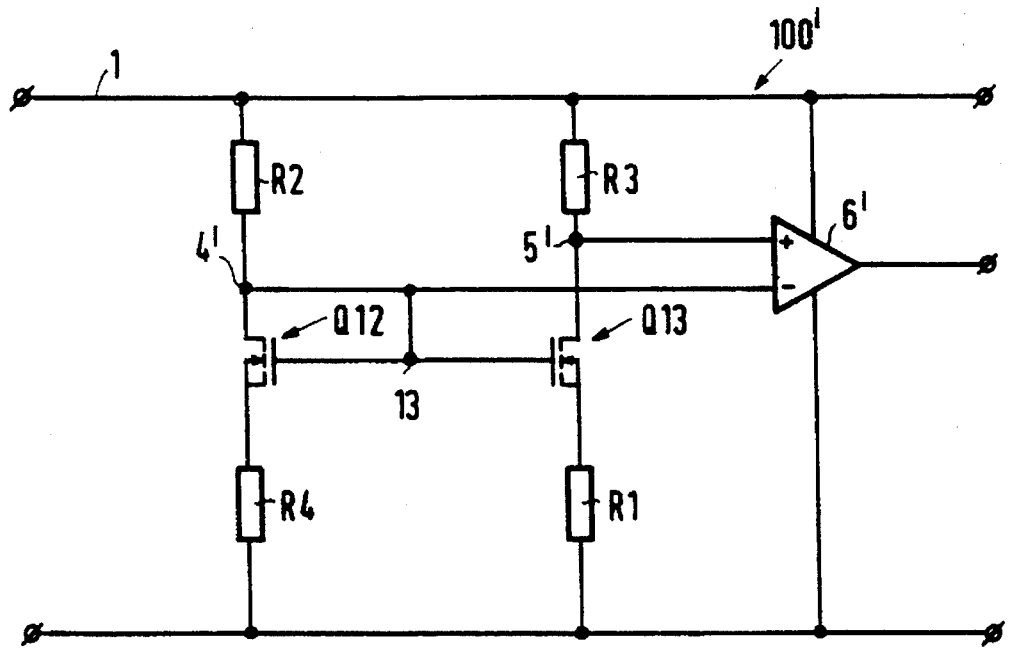
FIG. 4 illustrates a circuit diagram for a modified version of the differential temperature sensing circuit shown in FIG. 1.

FIG. 4 illustrates the circuit diagram of a modified version 100' of the differential temperature sensing circuit shown in FIG. 1.

In the circuit shown in FIG. 4, a first n-channel MOSFET Q12 is connected in series between the resistors R2 and R4 so that its source is connected to resistor R4 and its drain to resistor R2. A second n-channel MOSFET Q13 matched or similar to MOSFET Q12 is connected between the resistors R3 and R1 with its source connected to the resistor R1 and its drain connected to the resistor R3.

The gates of the two MOSFETs Q12 and Q13 are connected together at a node 13 and the gate of the MOSFET Q12 is connected to its drain at node 4'. The node 4' is also connected to one input of a comparator 6' while a node 5' between the resistor R3 and the drain of MOSFET Q13 is connected to the other input of the comparator 6'. The comparator 6' may have any suitable form and may be similar to the comparator 6 shown in FIG. 1.

Assume, in the interests of simplicity, that the gain of the MOSFETs Q12 and Q13 is very high so that their gate-source voltage Vgs is nearly constant. When the resistors R1 to R4 are all at the same temperature R3=KR2 and R4=KR1 with K being, for example, about 1.1. If the current through resistor R2, MOSFET Q12 and resistor R4 is defined as I' the current I" flowing through resistor R1 is approximately (R4/R1)I'=KI'. The voltage across resistor R2 is I'R2. The voltage across resistor R3 is I"R3= KI'R3=K$^2$I'R2. The difference in voltage between the nodes 4' and 5' is therefore:

$$\Delta V=I'R2(1-K^2)$$

As the temperature of the hot resistors R2 and R1 increases the value of K will decrease until K=1 when the temperature difference between the hot resistors R2 and R1 and the cold resistors R3 and R4 reaches the critical value. At this point the difference in voltage $\Delta V=0$. As the temperature of the resistors R1 and R2 increases further the resistance of the resistors R1 and R2 will exceed that of the resistors R3 and R4 and the comparator 6' will provide a signal for switching off the active semiconductor device 11. As mentioned above, the comparator 6' may be similar to the comparator 6 shown in FIG. 1, may be connected to a similar output stage (MOSFETs Q8 and Q7) and may be provided with a similar hysteresis circuit 20 to that shown in FIG. 1.

The incorporation of the current-mirror connected MOSFETs Q12 and Q13 enables a larger differential gain which results in a lower accuracy requirement for the comparator 6. Because the circuit 100 of FIG. 4 should have a higher sensitivity than the circuit 100' of FIG. 1, it may be useful where the resistors R1 to R4 have a smaller temperature coefficient of resistance or a higher noise margin, which characteristics will primarily be determined by the process used to form the resistors.

Although the temperature sensing circuit shown in FIG. 1 enables the active device 11 to be switched off when a certain differential temperature is detected under given ambient temperature conditions, the resistances of the resistors R1,R2,R3 and R4 vary with ambient temperature so that the differential temperature at which the Wheatstone bridge formed by the four resistors R1,R2,R3,R4 is brought into balance may vary depending upon the ambient temperature, that is upon the temperature of the cold resistors R3 and R4.

Figure 5:
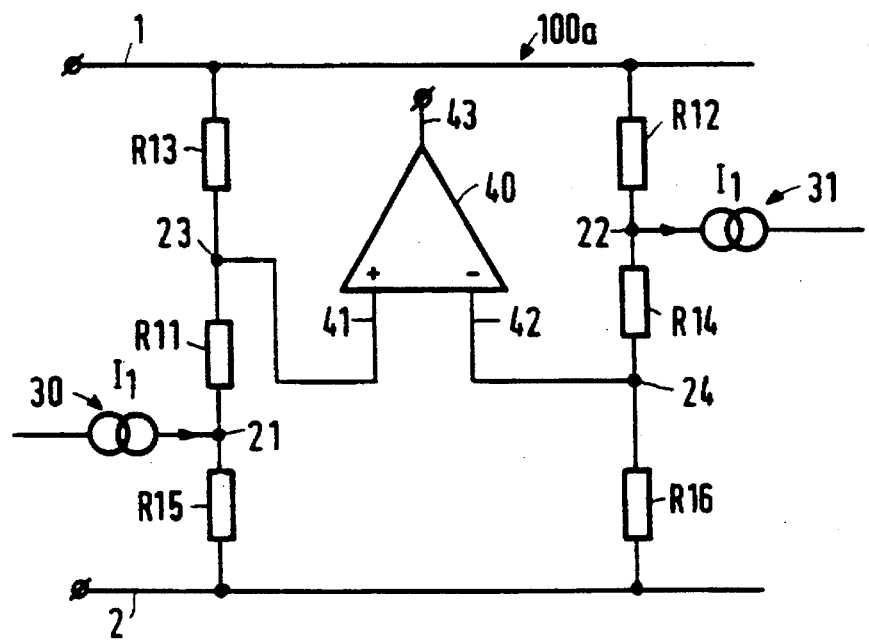
FIG. 5 is a simplified schematic diagram for illustrating the principle of a further form of differential temperature sensing circuit in accordance with the invention.

FIG. 5 illustrates schematically the basic components of one example of a temperature sensing circuit 100a designed to mitigate the effects of a change in ambient temperature.

As illustrated in FIG. 5, the first temperature sensing device of the temperature sensing circuit 100a again comprises two resistors R11 and R14 which are located adjacent the periphery 12 of the active device 11 (that is in a position similar to the resistors R1 and R2 shown in FIG. 3). In this example, the second temperature sensing device comprises two resistors R13 and R16 which are located away from the periphery 12 of the active device 11 in a position similar to that of the resistors R3 and R4 shown in FIG. 3. Two further 'cold' resistors R12 and R15 are similarly located away from the periphery 12 of the active device 11.

The resistor R13 is connected to the power supply line 1 and in series with the resistor R11 which is connected via the resistor R15 to the power supply line 2. The resistors R12,R14 and R16 are similarly connected in series with the resistor R14 connected to the power supply line 1 via the resistor R12 and to the power supply line 2 via the resistor R16.

A first current source 30 derived from a proportional-to-absolute temperature (PTAT) voltage source (not shown in FIG. 5) is connected to a junction 21 between the resistors R11 and R15 to draw a current $I_1$ through the series-connected resistors R13,R11 and R15 and a second similar current source 31 is connected to a junction 22 between the resistors R12 and R14 to, in this example, draw the same current current $I_1$ through the series-connected resistors R12,R14 and R16. The circuit may be arranged, depending for example, on the respective values of the resistors, so that the two current sources 30 and 31 do not draw the same currents.

A comparator 40 has a first positive input 41 connected to a junction 23 between the resistors R13 and R11 and a second negative input 42 connected to a junction 24 between the resistors R14 and R16. The comparator 40 may be of any suitable type and may, for example, be similar to the comparator 6 shown in FIG. 1. The comparator 40 provides an output signal on output line 43, indicating the presence of a given differential temperature.

Although not shown in FIG. 4, a hysteresis circuit similar to the circuit 20 shown in FIG. 1 may be provided to inhibit hunting or cycling of the temperature sensing circuit 100a.

Figure 6:
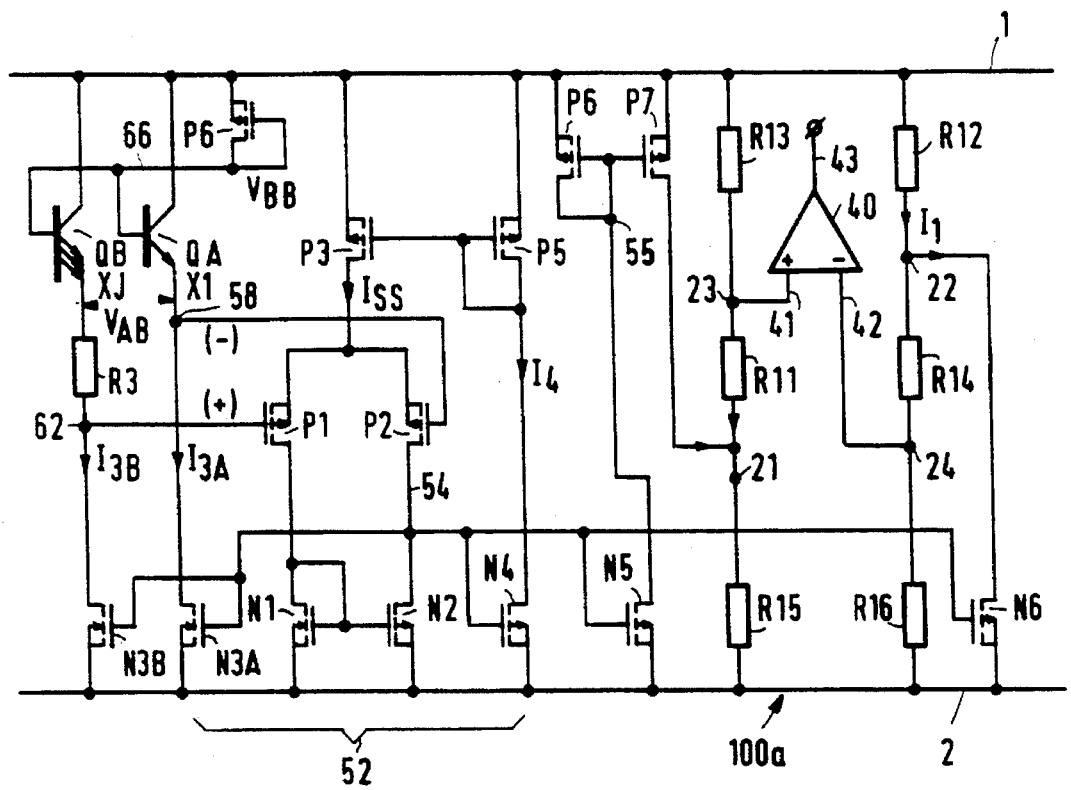
FIG. 6 is a circuit diagram of a second embodiment of a differential temperature sensing circuit in accordance with the invention based on the principle illustrated in FIG. 5.

FIG. 6 illustrates one example of the detailed implementation of the circuit 100a shown in FIG. 5.

The circuit 100a shown in FIG. 6 uses a differential amplifier 52 to provide the first and second current sources 30 and 31. However, it will of course be appreciated by those skilled in the art that various such current sources are known in the prior art, and that which will be described represents just one possible arrangement.

The differential amplifier 52 comprises two p-channel MOSFETS P1 and P2 in a long-tailed pair configuration, with their common source current $I_{SS}$ supplied from the power supply line 1 via a further p-channel transistor P3. The drains of the p-channel pair P1,P2 are connected to the other power supply line 2 via an n-channel current mirror active load formed by a diode-connected MOSFET N1 and a MOSFET N2, respectively. Two n-channel MOSFETs N3A and N3B have their gates connected to the junction 54 of the drains of the MOSFETs P2 and N2, and form first and second output transistors of the differential amplifier 52, respectively. Although not shown in FIG. 6, as will be appreciated by the person skilled in the art, a start-up circuit may be required to raise the voltage at node 54, initially. The start-up circuit may be of any suitable conventional form.

The drain of the first output transistor N3A is connected at a node 58 to the emitter of a first n-p-n bipolar transistor QA, whose collector is connected to the power supply line 1. The drain of the second output transistor N3B is connected via a further resistor R3 to the emitter of a second n-p-n bipolar transistor QB whose collector is also connected to the power supply line 1. The second bipolar transistor QB has an effective emitter area which is a known factor J times larger than that of the first bipolar transistor QA.

The bipolar transistors QA (x1) and QB (xJ) both have their bases connected to a bias rail 66, which is connected via a diode-connected p-channel MOSFET P6 to the power supply line 1. The node 58 is connected to the gate of MOSFET P2 which forms the inverting input (−) of the differential amplifier 52. The node 62 is connected to the gate of MOSFET P1 which forms the non-inverting input (+) of the amplifier 52.

In operation, the diode-connected p-channel MOSFET P6 serves to hold the bias rail 66 at a voltage $V_{BB}$ which is just a few volts below that of the power supply line 1. This provides enough "headroom" for the operation of the differential amplifier 52. The output transistors N3A and N3B of the differential amplifier 52 draw currents $I_{3A}$ and $I_{3B}$ through the first and second bipolar transistors QA (x1) and QB (xJ) respectively.

If the output transistors N3A and N3B are matched, then the currents $I_{3A}$ and $I_{3B}$ must be equal. Therefore, the current density in the first bipolar transistor QA (x1) is J times larger than that in the second bipolar transistor QB (xJ). It can therefore be predicted that there will be a difference $V_{AB}$ between the base-emitter voltage drops across the two bipolar transistors QA and QB, given by the equation:

$$V_{AB} = \frac{kT}{q} \ln(J),$$

where k is Boltzmann's constant $(1.38 \times 10^{-23}$ joule.kelvin$^{-1})$, T is absolute temperature in kelvin, q is the electronic charge $(1.6 \times 10^{-19}$ coulomb) and in(J) is the natural logarithm of the factor J.

Since the bases of the bipolar transistors QA and QB are both connected to the bias rail 66 ($V_{BB}$), the PTAT voltage difference $V_{AB}$ appears between their emitters, as shown. At the same time, the feedback from the output transistors N3A and N3B to the inputs (−) and (+) of the differential amplifier 52 ensures that the voltages at the nodes 58 (−) and 62 (+) are equal. This in turn means that the PTAT voltage signal $V_{AB}$ is impressed across the resistor R3, so that:

$$I_{3B} = V_{AB}/R3.$$

A third n-channel output MOSFET N4 also has its gate connected to the same node 54 as that of the first and second output transistors N3A and N3B, and therefore generates a current $I_4$ proportional to $I_{3A}$ and $I_{3B}$. This current $I_4$ is fed to the diode-connected input MOSFET P5 of a p-channel current mirror whose output transistor P3 supplies the bias current $I_{SS}$ for the differential amplifier 52. With appropriate scaling of the geometries of the MOSFETs N3A, N3B, N4, P5 and P3, this feedback biasing arrangement can eliminate the systematic offset errors which would otherwise occur when the differential amplifier 52 drives a non-infinite impedance load as it does in the present circuit. This biasing technique is described in detail in GB-A-2222497, which corresponds to U.S. Pat. No. 4,987,379 (Jan. 22, 1991). That application also describes an arrangement which may be necessary for avoiding undesirable latch-up conditions, but is not shown in FIG. 6 for the sake of clarity.

Thus far the circuit described above and shown in FIG. 6 is similar to that shown in FIG. 3 of EP-A-369530, which corresponds to U.S. Pat. No. 5,039,878 (August 13, 1991), and for convenience the same reference numerals have been used to indicate the same components. However, in other respects, the circuit 100a of FIG. 6 differs from that of FIG. 3 of EP-A-369530. Thus, as shown in FIG. 6, the node 54 is also connected to the gates of fourth and fifth output n channel MOSFETs N5 and N6, respectively, which have their sources connected to the power supply line 2. The drain of the fourth output transistor N5 is connected at node 55 to the connected gates of a pair of p-channel MOSFETs P6 and P7 which have their sources conected to the power supply line 1. The drain of the p-channel MOSFET P6 is connected to its gate so as to form a current mirror arrangement. The drain of MOSFET P7 is connected to the junction 21 between the resistors R11 and R15. The drain of the transistor N6 is connected to the junction 22 between the resistors R12 and R14.

The MOSFET N5, with the associated current mirror arrangement P6 and P7, and the MOSFET N6, like MOSFET N4, mirror the current in the transistors N3A and N3B and thus draw a current $I_1$ proportional to $I_{3B}$ and $I_{3A}$ through their respective series-connected resistors R13,R11 and R15 and R12,R14 and R16.

The current $I_1$ can be adjusted by a suitable choice of the resistance of the resistor R3. Although it is preferred that the MOSFETs N5 and N6 be matched so that they draw the same current $I_1$, the MOSFETs N5 and N6 may merely be similar with the relative values of the currents flowing through the MOSFETs N5 and N6 being determined by their relative geometries. If desired negative versions of the currents $I_{3A}$ and $I_{3B}$ through the MOSFETs $N_{3A}$ and $N_{3B}$ may be obtained by appropriate use of current mirrors.

It should of course be appreciated that all of the resistors R3,R13,R11,R15,R12,R14 and R16 should respond in the same way to changes in temperature and thus should be fabricated using the same process. As in the example described above with reference to FIG. 1, the resistors may be, for example, diffused resistors or doped polycrystalline silicon resistors.

In order to produce an output signal from the comparator 40 for causing the active device 11 to be switched off, then the voltage difference $\Delta V$ between the negative and positive input lines 42 and 41 of the comparator should be zero, that is the bridge should be in balance.

Defining Rx as the value of a resistor at 25 degrees Celsius and R'x as the resistance at some other temperature T so that R'x=Rx (1+tc (T−298))
where T is the temperature in degrees Kelvin
and tc is the temperature coefficient of resistance and letting Rc equal the resistance of the cold resistors R13 and R16, Rh equal the resistance of the hot resistors R14 and R11 and Rs equal the resistance of the resistors R15 and R12 then (Rc+Rh+Rs) $\Delta V=V$ (Rc−Rh−Rs)−2RsR'c$I_1$(298), where $I_1$(298) is the value of the current $I_1$ at 25 degrees Celsius (298 degrees Kelvin), then, when the whole semiconductor body 10 is at 25 degrees Celsius, from above:

$$I_1(T) = I_{3B} = \frac{VAB}{R'3} = \frac{kT\ln(J)}{qR'3}$$

let $\frac{k\ln(J)}{q} = A$

The circuit should provide a signal to switch off the active device 11 when the overall temperature of the circuit reaches a certain maximum allowable temperature Tc, for example 423 degrees Kelvin. No local heating in the active device 11 is permitted under these circumstances and $\Delta V=0$ so that $$V(Rc-Rh-Rs) = \frac{2ATcRsRc}{R3}$$

Accordingly the critical temperature Tc is selected by selecting the values of the resistors Rc, Rh, Rs.

The other situation of interest is when the chip is at a normal ambient temperature, for example 25 degrees Celsius, but a high transient power dissipation occurs in the active device 11 and the temperature of the hot resistors R14 and R11 is raised. Under these circumstances, the circuit should provide a signal to switch off the active device 11 when the differential temperature between the 'hot' resistors R11 and R14 and the 'cold' resistors R13 and R16 reaches a critical value $\Delta Tc$. Again $\Delta V$ is zero and $$V(Rc-Rs-Rh\ (1+tc\Delta Tc))=2ATRsRC/R3$$

From these equations, the values of the resistors can be calculated so that the behaviour of the circuit can be optimised so that the predetermined value is not adversely affected by the actual temperatures sensed but remains approximately constant, that is the circuit operation is substantially independent of the absolute or actual temperature sensed. In some circumstances, it may be desirable for the circuit to become more sensitive (that is for the differential value to decrease) with an increase in the actual sensed temperatures.

The above description assumes that the two hot resistors R11 and R14 have the same resistance as the two cold resistors R13 and R16. However, advantages may be gained in terms of the temperature dependency by making the bridge asymmetric so that the respective pairs of resistors do not necessarily have the same resistance.

The use of the Wheatstone bridge arrangement described above amplifies the difference signal being detected because the increase in temperature and thus, in the example described, resistance of the first heat sensitive device acts to increase the voltage at the first junction whereas the similar increase in temperature experienced by the second heat sensitive device acts to reduce the voltage at the second junction.

It has been assumed in the example described above that the heat sensitive elements have positive temperature coefficients, that is that their resistance increases with temperature. However, it is possible that heat sensitive elements with negative temperature coefficients could be used by for example, modifying the circuit shown in FIG. 1 appropriately so that a low output 7 from the comparator 6 switches off the active device or by reversing the position within the Wheatstone bridge of the elements R1 and R3 and the elements R2 and R4 so that a reduction in the resistance of elements R1 and R2 caused by a temperature increase results in the voltage at the first junction 4 exceeding the voltage at the second junction 5. Also, although in the example described above, the heat sensitive elements are provided as resistors, other devices having temperature dependent resistances, for example diodes (or base-collector connected bipolar transistors functioning as diodes) could be used.

The temperature sensing circuit 100 described above thus enables a steep temperature gradient to be detected and to be used to switch off the active device before it overhears significantly. This form of temperature sensing circuit is more sensitive than a single sensor and may be realised more easily and accurately than a temperature sensing circuit using a single temperature sensing element.

Figure 7:
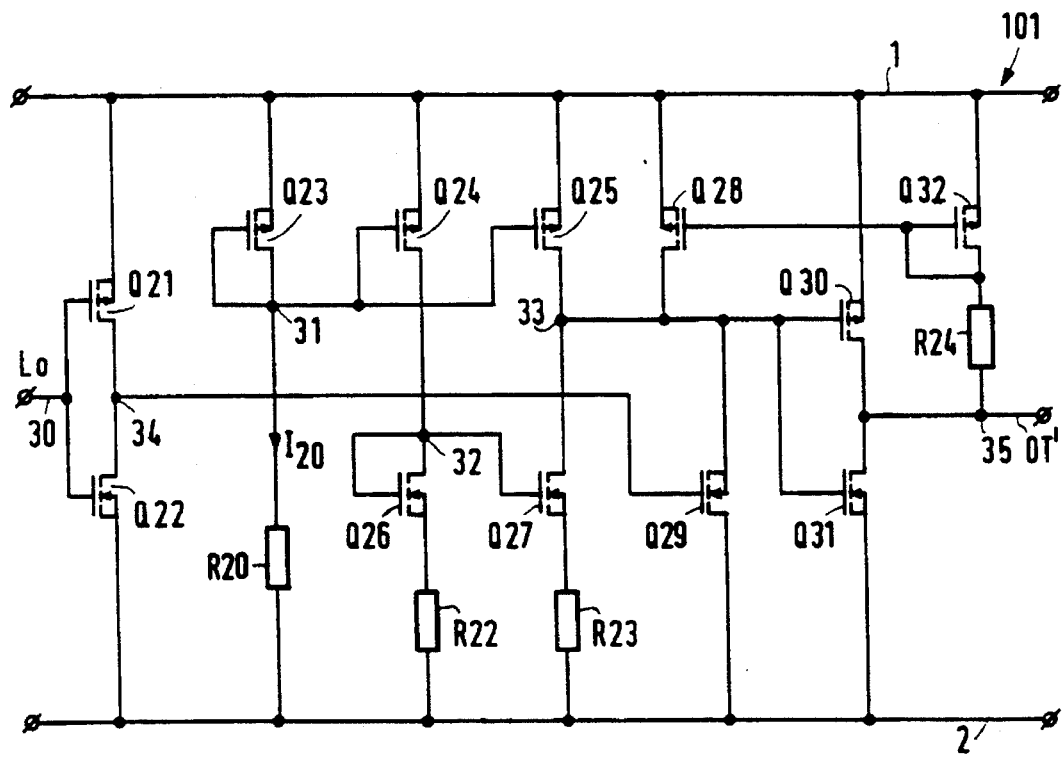
FIG. 7 is a circuit diagram of a third embodiment of a differential temperature sensing circuit in accordance with the invention.

FIG. 7 illustrates a further embodiment of a temperature sensing circuit 101 in accordance with the invention.

In the example illustrated in FIG. 7 the temperature sensing devices are not resistors but are formed, as will be described below, by insulated gate field effect transistors (MOSFETs or IGFETs) which have different temperature characteristics from resistors and enable the temperature sensing circuit to be less sensitive to the absolute temperature (that is the ambient temperature) than is the case for the circuit 100 shown in FIG. 1.

In the circuit 101 shown in FIG. 7, the first temperature sensing device is formed by a p-channel MOSFET Q25 and the second temperature sensing device by a p channel MOSFET Q24. The p channel MOSFET Q25 is integrated so as to be close to the periphery 12 of the active device 11, that is so as to be in a position analogous to that of the 'hot' resistors R1 and R2 in FIG. 3, while the p-channel MOSFET Q24 is integrated so as to be removed from the periphery 12 of the active device 11, that is so as to be in a position analogous to the 'cold' resistors R3 and R4 in FIG. 3. The two p-channel MOSFETs Q24 and Q25 are integrated with the active device 11 so that their conduction channel regions extend parallel to the adjacent portion of the periphery 12 of the active device so as to avoid or at least reduce the possibility of a temperature gradient along the conduction channel regions. This orientation has also been found to give the fastest response. The two p-channel MOSFETs Q24 and Q25 have relatively short and wide conduction channel regions (where the width is that direction transverse to the direction of flow of charge carriers along the conduction channel region) and the conduction channel region of the cold p-channel MOSFET Q24 is arranged to have a width which is x times wider than the width w of the conduction channel region of the hot p-channel MOSFET Q25. In this particular example x may be 1.1.

The sources of the MOSFETs Q24 and Q25 are connected to the power supply line 1 while their gates are connected together and to a node 31 to which are connected the gate and drain of a p-channel MOSFET Q23. The source of the p-channel MOSFET Q23 is connected to the power supply line 1 while its drain and gate are connected via a resistor R20 to the power supply line 2. The MOSFETs Q23,Q24 and Q25 thus form a current mirror arrangement and the current $I_{20}$ through resistor R1 is mirrored in MOSFETs Q24 and Q25. In this example, the MOSFET Q23 is matched to the MOSFET Q25 so that a current $I_{20}$ flows through MOSFET Q25 but, by virtue of its wider conduction channel region, a current $xI_{20}$ flows through MOSFET Q24, thereby providing a well defined bias point for MOSFETs Q24 and Q25.

The drains of MOSFETs Q24 and Q25 are connected to the sources of respective n channel MOSFETs Q26 and Q27 of a current mirror pair at nodes 32 and 33. As shown the gate of MOSFET Q26 is connected to its drain at node 32 and the gate of MOSFET Q27 is connected to the gate of MOSFET Q26 at node 32. The sources of the MOSFETs Q26 and Q27 are connected to the power supply line 2. This connection may be via respective resistors R22 and R23 which may be used to improve the accuracy of the current mirror.

The node 33 is also connected via the main current path of a p-channel MOSFET Q28 to the power supply line 1 and via the main current path of an n-channel MOSFET Q29 to the power supply line 2. The gate of MOSFET Q28 is connected to the gate of a gate-drain connected p-channel MOSFET Q32 whose source is connected to the power supply line 1 and whose drain is connected via a resistor R24 to an output line 35. The MOSFETs Q28 and Q32 thus form a current mirror arrangement.

The gate of MOSFET Q29 is connected to a node 34 connecting the respective drains of complementary MOSFETs Q21 and Q22 which form an inverting input buffer and whose connected gates receive an input logic signal Lo.

The node 33 is also connected to the connected gates of complementary MOSFETs Q30 and Q31 forming an inverting output buffer. The connected drains of the complementary MOSFETs Q30 and Q31 are connected to the output line 35.

In operation of the temperature sensing circuit 101 shown in FIG. 7, a current $I_{20}$ flowing through resistor R20 is mirrored in MOSFETs Q24 and Q25. However, as the conduction channel region of MOSFET Q24 is x times wider than that of MOSFETs Q23 and Q25, a current $xI_{20}$, in the example described 1.1 $xI_{20}$ flows through MOSFET Q24.

The currents flowing in MOSFETs Q24 and Q25 are received by the current mirror formed by the MOSFETs Q26 and Q27 (and resistors R22 and R23, if present). The MOSFET Q27 therefore attempts to sink the current $xI_{20}$ from MOSFET Q25. However, the MOSFET Q25 is only mirroring the current $I_{20}$ and accordingly the drains of the MOSFETs Q25 and Q27 are held at the voltage of the power supply line 2, VLOW. The inverting output buffer Q30 and Q31 supplies a normally high signal OT' on the output line 35.

If the logic input signal Lo on input line 30 is low, then the inverting input buffer formed by MOSFETs Q21 and Q22 supplies a high signal to the gate of MOSFET Q29 which is then conducting and thus ensures that the currents flowing through MOSFETs Q25 and Q28 are sunk to ground (VLOW) and that the input of the inverting output buffer formed by MOSFETs Q30 and Q31 is held low so that the output signal OT' is held high.

If the input signal Lo is high, then the output of the inverting input buffer Q21, Q22 is low and MOSFET Q29 is switched off. If then a temperature gradient occurs, that is the temperature at the centre of the active device 11 (see FIG. 3) rises more rapidly than the temperature of the surrounding semiconductor body, the threshold voltage of the 'hot' MOSFET Q25 will fall more than the threshold voltage of the 'cold' MOSFET Q24 and so MOSFET Q25 will be able to source a larger current than $I_{20}$. With a large enough temperature gradient the output current of MOSFET Q25 will exceed the current $xI_{20}$ mirrored by the MOSFETs Q26 and Q27, the input to the inverting output buffer Q30 and Q31 will go high and the output signal OT' on output line 35 will therefore go low signifying an excessive differential temperature. The low output signal OT' may be used to turn off the active device 11. The current flowing through resistor R24 will be mirrored by the current mirror arrangement formed by MOSFETs Q28 and Q32 and added to the current supplied to MOSFET Q27 from MOSFET Q25. Therefore positive feedback is applied and the temperature differential will have to fall to a lower value before the output signal OT' again becomes high.

If resistor R24 has a small enough value then the current through MOSFET Q28 may be larger than $xI_{20}$ and the output signal OT' will be latched low. The circuit may however be unlatched by taking the logic input Lo low so that $I_{20}$ and the current through MOSFET Q28 are sunk via MOSFET Q29. On the other hand if the value of resistor R24 is large enough, then the circuit 101 will have hysteresis, in terms of the sensed temperature gradient, as mentioned above.

The use of the variation in gate threshold voltage of MOSFETs with temperature in the circuit 101 of FIG. 7 is such that, with suitable biasing by the resistor R20, the sensitivity of the circuit is essentially independent of the ambient temperature because of the near linear temperature coefficient of the threshold voltage of MOSFETs which are operated in their subthreshold region (see for example S. M. Sze: Physics of Semiconductor Devices 2nd Edition published by John Wiley & Sons. Inc, at pages 446–447), and the high gain of these devices. In addition a latching or alternatively a hysteresis function may be achieved by selecting the value of resistor R24 appropriately.

A similar effect could be achieved by making the threshold voltages $V_{th}$ of MOSFETs Q24 and Q25 the same at the same temperature but making the channel widths of MOSFETs Q26 and Q27 different so that, for example, the width of the channel of MOSFET Q27 is 1.1 times that of MOSFETs Q24, Q25 and Q26.

Figure 8:
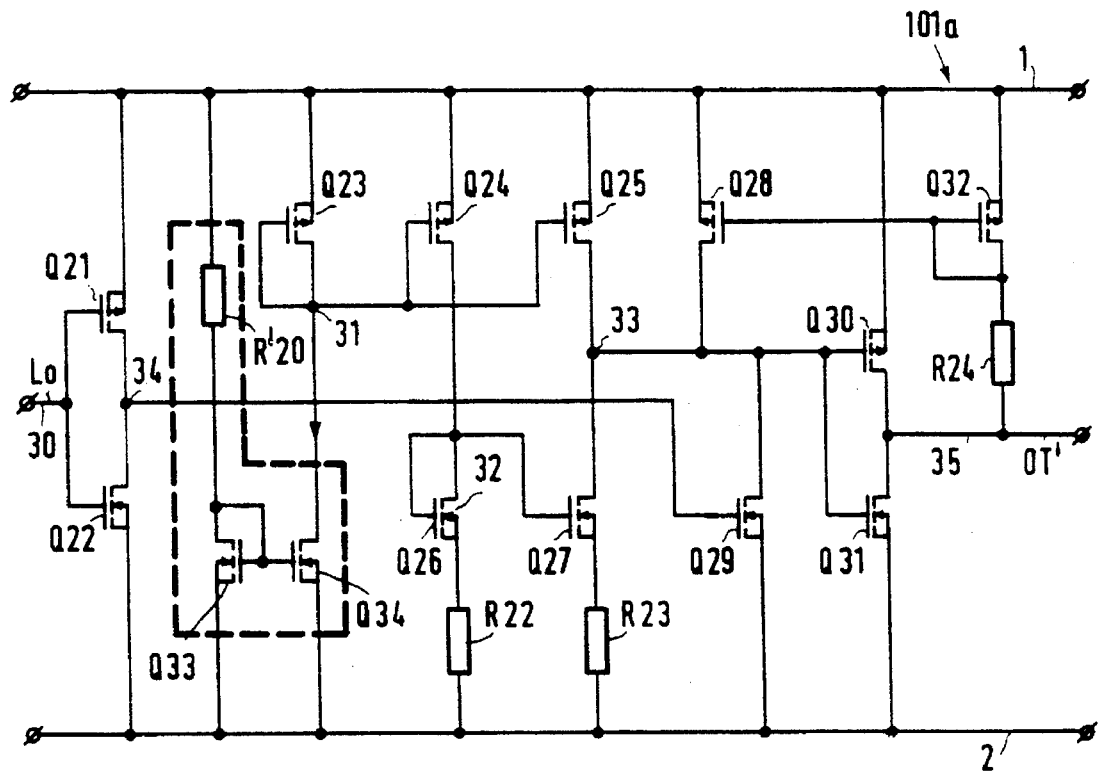
FIG. 8 is a circuit diagram of a first modified version of the differential temperature sensing circuit shown in FIG. 7.

FIG. 8 illustrates a modified version 101a of the circuit of FIG. 7. Insofar as the circuit is concerned, the only modification is that highlighted by the enclosure in phantom lines in FIG. 8, namely the addition of a current mirror arrangement to couple the resistor R'20 to the MOSFET Q23. Thus, as shown in FIG. 8, the resistor R'20 is connected directly to the power supply line 1 and via the main current path of a gate-drain connected n-channel MOSFET Q33 to the power supply line 2. The gate of MOSFET Q33 is connected to the gate of n-channel MOSFET Q34 whose main current path is connected between node 31 and the second power supply line 2. The MOSFET Q33 has a channel width y, typically 10, times greater than that of Q34 so that MOSFET Q33 can carry a current of, $yI_{20}$. This allows the use of a physically small resistor R20 with a low resistance while still enabling the temperature sensing devices Q24 and Q25 to be operated at a relatively low current density. The temperature sensitivity of the threshold voltage of MOSFETs is higher when they are operated at very low current densities and so the sensitivity of the circuit to temperature gradient should be improved. In addition the reduction in carrier mobility and gain with temperature should be reduced.

The resistor R24 may also be made physically small if the MOSFETs Q28 and Q32 forming the positive feedback current mirror also have a difference in channel width (that is if the channel of MOSFET Q32 is larger, again for example y times larger, than that of the MOSFET Q28), to reduce the positive feedback and so allow selection of a latching or hysteresis function by selecting the value of resistor R24.

To give examples, the MOSFETs Q23 and Q25 may have a channel width of 100 μm (micrometers) while the MOSFET Q24 has a channel width of 150 μm (X=1.5). The MOSFETs Q34 and Q28 may have a channel width of 20 μm while the MOSFETs Q33 and Q32 may have a channel width of 200 μm (y=10). MOSFETs Q21, Q30, Q26 and Q27 may have channel widths of 20 μm while MOSFETs Q29, Q22 and Q31 may have channel widths of 10 μm.

The circuit 101a shown in FIG. 8 has the additional advantages of a lower current consumption than that shown in FIG. 7, improved sensitivity and/or smaller occupied chip area and should provide a greater freedom in the choice of biasing currents because the bias current for MOSFETs Q24 and Q25 is now reliably adjustable over an extra decade due to the ratioed current-mirror formed by MOSFETs Q33 and Q34.

It will, of course, be appreciated that all components should be provided in a low temperature gradient area of the semiconductor body remote from the active device 11 (see FIG. 3) except, of course, the temperature sensing devices, in particular the 'hot' temperature sensing device, and any logic components which can function in high temperature gradient areas, for example MOSFETs Q21, Q22, Q30 and Q31.

Figure 9:
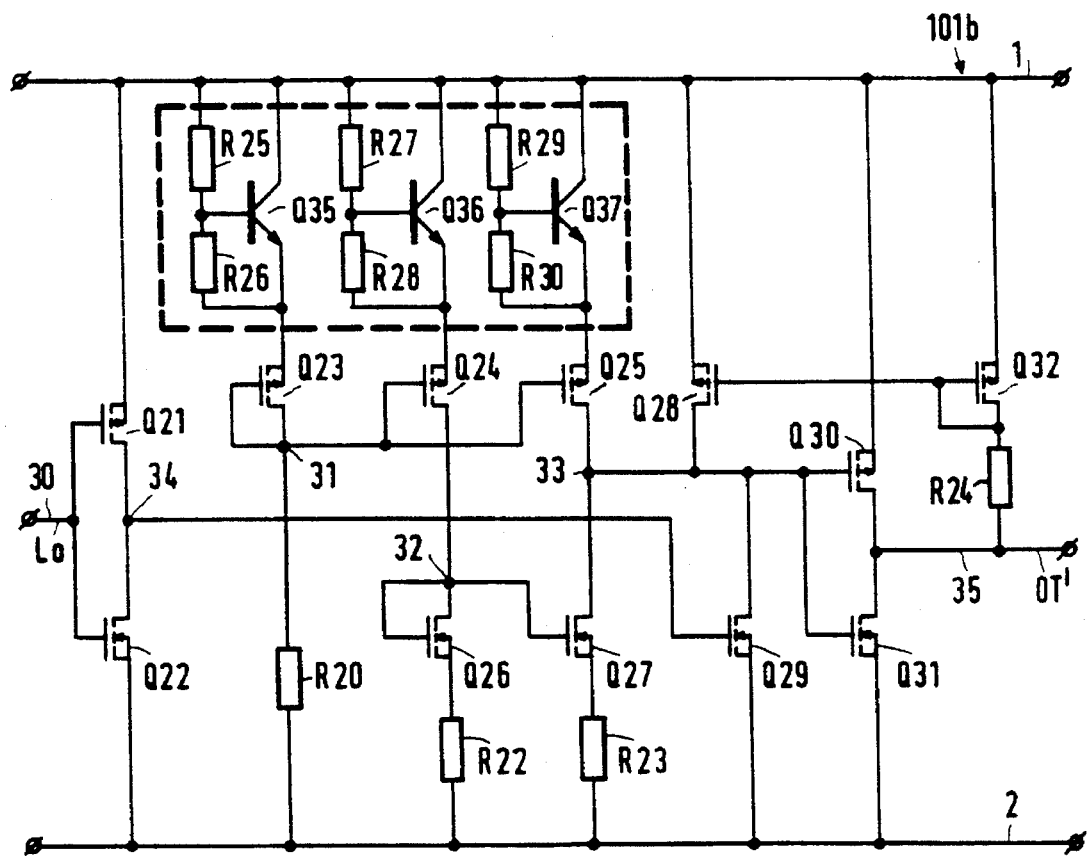
FIG. 9 is a circuit diagram of a second modified version of the differential temperature sensing circuit shown in FIG. 7.

FIG. 9 illustrates a different modified version 101b of the circuit shown in FIG. 7 in which the source of each of the MOSFETs Q23, Q24 and Q25 is not directly connected to the positive power supply line 1 but is connected via a respective bipolar circuit arrangement such that the main current paths of npn bipolar transistors Q35, Q36 and Q37 extend between the source of the respective MOSFETs Q23, Q24 and Q25 and the power supply line 1. The base of each bipolar transistor is connected to the power supply line 1 via a respective resistor R25, R27 and R29 and to its emitter via a respective resistor R26, R28 and R30. In all other respects the circuit shown in FIG. 9 is the same as that shown in FIG. 7. It should be appreciated that the modification of FIG. 8 may also be applied to the circuit 101b shown in FIG. 9.

In the example illustrated in FIG. 9, all of the MOSFET current mirror arrangements are provided in the low temperature area of the semiconductor body away from the active device 11. In this case, the first 'hot' temperature sensing device comprises the bipolar transistor Q37 which is located adjacent the periphery 12 of the active device 11 in a manner analogous to the resistors R1 and R2 in FIG. 3 while the second 'cold' temperature sensing device comprises the bipolar transistor Q36 which is located away from the periphery 12 of the active device 11 in a manner similar to that of resistors R3 and R4 in FIG. 3. The bipolar transistor Q35 is similarly located away from the periphery 12 of the active device 11 (see FIG. 3).

Each of the bipolar transistors Q35, Q36 and Q37 with its associated resistors R25, R26, R27, R28 and R29, R30 forms a Vbe (base-emitter) voltage multiplier and acts as a source feedback for the associated one of the MOSFETs Q23, Q24 and Q25. In all other respects the circuit of FIG. 9 is the same as that of FIG. 7.

In operation of the circuit shown in FIG. 9, the source feedback to MOSFETs Q24 and 025 depends on the Vbe of bipolar transistors Q36 and Q37. When a differential temperature gradient arises then the bipolar transistor Q37 will be hotter than the bipolar transistor Q36 and the Vbe of the bipolar transistor Q37 will fall reducing the negative feedback in the source of MOSFET Q25 so that the output current from MOSFET Q25 may exceed the mirrored current from MOSFET Q27. In all other respects the circuit of FIG. 9 operates in a similar manner to the circuit of FIG. 7.

The circuit 101b of FIG. 9 enables all MOS matched MOSFETs to be fabricated in close proximity to each other, thereby improving their matching. Also bipolar transistors are simpler and may be matched more closely than MOSFETs when a significant distance between 'hot' and 'cold' sensors is required. The resistors R25 to R29 multiply the temperature coefficient of the base-emitter voltages Vbe of the bipolar transistors Q35 and Q37 to enhance the sensitivity. These resistors may also be placed as additional temperature sensors in the substrate to fine tune the sensitivity versus temperature.

Although in the examples described above the temperature sensing elements are generally provided within the semiconductor body, they could be provided on top of the semiconductor body by, for example, the use of polycrystalline silicon or other suitable material structures provided on top of the semiconductor body. In such a case, it may even be possible for the 'hot' temperature sensing element, for example, resistors R1 and R2 in FIGS. 1 to 4, resistors R11 and R14 in FIGS. 5 and 6, transistor Q25 in FIGS. 7 and 8 and transistor Q37 in FIG. 9, to be provided directly on top of or even in a small area defined within the active semiconductor device 11 rather than adjacent the periphery of the active semiconductor device 11.

In addition, where appropriate, the MOSFETs used in the circuit 100 shown in FIG. 1, and comparable components in FIGS. 4 to 9, may be replaced by other suitable components, for example, bipolar transistors, and the active device 11 may be a power device other than a power MOSFET, for example, a power bipolar transistor or thyristor or an insulated gate bipolar transistor. The active device could also be a lateral rather than a vertical device.

It will be appreciated that whereas the embodiments described herein contain enhancement mode MOSFETs of particular conductivity types, the inventive principle can equally be applied to circuits in which devices have the opposite conductivity type and signals have the opposite polarity, and to circuits using bipolar devices. It will also be appreciated that where a particular form of circuit has been shown for performing a function which is well-known per se (for example, a differential amplifier or a current mirror), there may be many other circuits for performing the same function which can be used in place of those described.

Although as described above, where it is desired to monitor the temperature of, for example, a so-called "smart-power" device the circuit 100 is integrated with the active device, it may be possible for only the first or hot temperature sensing device to be integrated so as to be in close thermal contact with the thermal source. The other parts of the circuit could thus be provided separately.

From reading the present disclosure, other modifications and variations will be apparent to persons skilled in the art. Such modifications and variations may involve other features which are already known in the semiconductor art and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly.

We claim:

1. A temperature sensing circuit for sensing the temperature of an active power semiconductor device of a semiconductor body, comprising: a first temperature sensing device provided on the semiconductor body at a first position adjacent the active semiconductor device for sensing the temperature of the active semiconductor device, a second temperature sensing device provided on the semiconductor body at a second position remote from the periphery of the active semiconductor device for sensing the temperature at a position remote from the active semiconductor device, and means responsive to the first and second temperature sensing devices for producing a control signal to switch off the active semiconductor device when a difference in the temperatures sensed by the first and second sensing devices exceeds a predetermined value, wherein the temperature sensing devices have a given characteristic the value of which varies in the same sense with temperature such that, when the difference in the temperatures sensed by the first and second temperature sensing devices reaches the predetermined value, the values of the given characteristics of the first and second temperature sensing devices are equal.

2. A temperature sensing circuit according to claim 1, wherein the temperature sensing devices have a resistance which varies with temperature.

3. A temperature sensing circuit according to claim 1, wherein the first and second temperature sensing devices comprise semiconductor devices having a current carrying capacity which varies with temperature and the means responsive to the first and second temperature sensing devices comprises a current mirror arrangement having a first transistor with one main electrode connected at a first junction to the first temperature sensing device so that its main current path is in series with the first temperature sensing device and a second transistor with one main electrode connected at a second junction to the second temperature sensing device so that its main current path is in series with the second temperature sensing device, the control electrodes of the first and second transistors being connected together with one of said transistors being diode-connected so that the voltage at the junction to which the said other one of the first and second transistors is connected provides an indication of the difference in the temperatures sensed by the first and second temperature sensing devices.

4. A temperature sensing circuit according to claim 3, wherein the current carrying capability of the first and second temperature sensing devices increases with temperature and the first temperature sensing device has a lower current carrying capability than the second temperature sensing device when the first and second temperature sensing devices are at the same temperature but has a current carrying capability equal to that of the second temperature sensing device when the temperature difference between the first and second temperature sensing devices reaches the predetermined value, and the second transistor is the diode connected one of the first and second transistors so that the voltage at the first junction becomes high when the temperature difference reaches the predetermined value.

5. A temperature sensing circuit according to claim 4, wherein the first and second temperature sensing devices comprise first and second transistors and the current mirror arrangement includes a further current mirror element that determines the current flowing through the second transistor with the level of the current being determined by the value of a resistor in the current mirror arrangement.

6. A temperature sensing circuit according to claim 5, wherein the first and second temperature sensing transistors comprise first and second insulated gate field effect transistors (IGFETs) operated in their subthreshold regions and the further current mirror element comprises a gate-drain connected third IGFET having its gate connected to gates of the first and second IGFETs.

7. A temperature sensing circuit according to claim 6, wherein the second IGFET has a conduction channel region having a width which is larger than that of the conduction channel region of the first IGFET.

8. A temperature sensing circuit according to claim 6, wherein the resistor is connected in series with a gate-drain connected transistor of two transistors forming another element of the current mirror arrangement and the main current path of the other transistors of the said other current mirror element is connected in series with a main current path of the third IGFET.

9. A temperature sensing circuit according to claim 5, wherein the first and second temperature sensing devices comprise first and second bipolar transistors and the further current mirror element comprises first, second and third IGFETs with the first and second IGFETs having their main current paths connected in series with the main current paths of the first and second bipolar transistors and the third IGFET having its gate and drain connected and its main current path being connected in series with a third bipolar transistor, each of the bipolar transistors having its base connected by respective resistors to its emitter and collector to form a base-emitter voltage multiplier for forming a source feedback for the associated IGFET, and wherein the second IGFET has a lower threshold voltage than the first IGFET.

10. A temperature sensing circuit for sensing the temperature of an active power semiconductor device of a semiconductor body, comprising: a first temperature sensing device provided on the semiconductor body at a first position adjacent the active power semiconductor device so as to be electrically isolated from but in thermal contact with the active power semiconductor device to sense the temperature thereof, a second temperature sensing device provided on the semiconductor body at a second position remote from the periphery of the active power semiconductor device so as to be electrically isolated from but in thermal contact with the semiconductor body remote from the active power semiconductor device to sense the temperature of the semiconductor body at the second position, and means responsive to the first and second temperature sensing devices for detecting a difference between the temperatures sensed by the first and second temperature sensing devices and for deriving a control signal to switch off the active power semiconductor device when the difference in the temperatures sensed by the first and second sensing devices exceeds a predetermined value.

11. A temperature sensing circuit for rapidly sensing an overload condition of an active semiconductor device of a semiconductor body comprising:

a first temperature sensing device provided on the semiconductor body at a first position adjacent the active semiconductor device for sensing the temperature of the active semiconductor device, a second temperature sensing device provided on the semiconductor body at a second position remote from the periphery of the active semiconductor device for measuring the temperature remote from the active semiconductor device, wherein the first and second temperature sensing devices are of the same type and having a given characteristic which varies in the same direction as a function of temperature, means responsive to the first and second temperature sensing devices for deriving a control signal when a temperature gradient occurs between the first and second temperature sensing devices that exceeds a predetermined value related to an overload condition in said active semiconductor device, and a hysterisis circuit coupled to at least one of said temperature sensing devices for altering an electric characteristic thereof so as to provide, after derivation of the control signal, a hysterisis action whereby a drop in the temperature gradient to a second predetermined value below the first predetermined value terminates the control signal.

12. A temperature sensing circuit for sensing the temperature of an active power semiconductor device of a semiconductor body comprising; first and second supply lines, first and second temperature sensing elements each having a resistance which varies with temperature and each being provided on the semiconductor body at a first position adjacent the active semiconductor device for sensing the temperature of the active semiconductor device, third and fourth temperature sensing elements each having a resistance which similarly varies with temperature and each being provided on the semiconductor body at a second position remote from the periphery of the active semiconductor device for sensing the temperature of the semiconductor body remote from the active semiconductor device, the temperature sensing elements being coupled in a Wheatstone bridge arrangement with the first and third elements coupled in series between the first and second supply lines and the second and fourth elements coupled in series between the first and second supply lines with a first junction between the first and third elements coupled to the first supply line via the third element and a second junction between the second and fourth elements coupled to the first supply line via the second element, a difference between a voltage at the first junction and a voltage at the second junction representing a difference between a temperature sensed by the first and second elements at the first position and a temperature sensed by the third and fourth elements at the second position, and means for comparing a first signal representing the voltage at the first junction and a second signal representing the voltage at the second junction and for providing a control signal for switching off the active semiconductor device when the difference between the temperatures sensed at the first and second positions exceeds a predetermined value.

13. A temperature sensing circuit according to claim 5, further comprising means for generating a proportional-to-absolute-temperature (PTAT) voltage and means for deriving a first current source for the first and third elements and a second current source for the second and fourth elements from the PTAT voltage.

14. A temperature sensing circuit according to claim 13, further comprising a resistance connected in series with a switch means across the fourth temperature sensitive element and with the switch means being controlled by the output signal of the comparing means to connect the resistance in parallel with the fourth temperature sensitive element when the temperature difference exceeds the predetermined value thereby preventing the active semiconductor device from being switched on again until the temperature difference has fallen to a second predetermined value below the first predetermined value.

15. A temperature sensing circuit according to claim 13, wherein the PTAT voltage generating means comprises first and second semiconductor junction devices having respective outputs across which is generated the PTAT voltage and the current source deriving means comprises a differential amplifier for which each semiconductor junction device provides an input signal to a respective one of the two inputs of the differential amplifier, a resistor connected in series between one of the semiconductor junction devices and an output transistor of the differential amplifier, a current mirror arrangement comprising first and second transistors for mirroring the current through the resistor, and means coupling the first transistor to the first and third elements for forming the first current source and the second transistor to the second and fourth elements for forming the second current source.

16. A temperature sensing circuit as claimed in claim 12 further comprising fifth and sixth temperature sensing elements provided on the semiconductor body at a position remote from the periphery of the active semiconductor device, said fifth temperature sensing element being connected in series with the first and third temperature sensing elements and the sixth temperature sensing element being connected in series with the second and fourth temperature sensing elements in a manner so as to provide compensation for changes in ambient temperature.

17. A temperature sensing circuit according to claim 7, further comprising a resistance connected in series with a switch means across the fourth temperature sensitive element and with the switch means being controlled by the output signal of the comparing means to connect the resistance in parallel with the fourth temperature sensitive element when the temperature difference exceeds the predetermined value thereby preventing the active semiconductor device from being switched on again until the temperature difference has fallen to a second predetermined value below the first predetermined value.

18. A temperature sensing circuit according to claim 12, wherein the comparing means comprises first and second transistors having control electrodes connected to the first and second junctions, respectively, a current mirror arrangement connected between the first supply line and one main electrode of each of the first and second transistors and current source means connected to the other main electrode of each of the first and second transistors, the control signal being supplied via an outpost connection from the one main electrode of the second transistor.

19. A temperature sensing circuit according to claim 18, further comprising a resistance connected in series with a switch means across the fourth temperature sensitive element and with the switch means being controlled by the output signal of the comparing means to connect the resistance in parallel with the fourth temperature sensitive element when the temperature difference exceeds the predetermined value thereby preventing the active semiconductor device from being switched on again until the temperature difference has fallen to a second predetermined value below the first predetermined value.

20. A temperature sensing circuit according to claim 5, further comprising; a transistor having its main current path connected between the first junction and the first element and another transistor having its main current path connected between the second junction and the fourth element and control electrodes with of the transistors being connected to one another and to one of the first and second junctions.

21. A temperature sensing circuit according to claim 20, wherein the comparing means comprises first and second transistors having control electrodes connected to the first and second junctions, respectively, a current mirror arrangement connected between the first supply line and one main electrode of each of the first and second transistors and current source means connected to the other main electrode of each of the first and second transistors, the control signal being supplied via an output connection from the one main electrode of the second transistor.

* * * * *